(12) United States Patent
Ingram et al.

(10) Patent No.: US 11,408,554 B2
(45) Date of Patent: Aug. 9, 2022

(54) GANTRY-TYPE POSITIONING DEVICE

(71) Applicant: ETEL S.A., Motiers (CH)

(72) Inventors: David Ingram, Epalinges (CH);
Laurent Heiniger, Neuchatel (CH)

(73) Assignee: ETEL S.A., Motiers (CH)

( * ) Notice: Subject to any disclaimer, the term of this patent is extended or adjusted under 35 U.S.C. 154(b) by 851 days.

(21) Appl. No.: 16/057,859

(22) Filed: Aug. 8, 2018

(65) Prior Publication Data
US 2019/0063669 A1  Feb. 28, 2019

(30) Foreign Application Priority Data

Aug. 24, 2017 (EP) ..................................... 17187633

(51) Int. Cl.
*F16M 11/20* (2006.01)
*F16M 11/04* (2006.01)
(Continued)

(52) U.S. Cl.
CPC ....... *F16M 11/2085* (2013.01); *F16M 11/046* (2013.01); *F16M 11/2092* (2013.01); *G05B 19/402* (2013.01); *H05K 13/0015* (2013.01); *H05K 13/0404* (2013.01); *G05B 2219/37193* (2013.01); *G05B 2219/40293* (2013.01); *H01L 21/681* (2013.01); *H05K 3/0008* (2013.01)

(58) Field of Classification Search
CPC combination set(s) only.
See application file for complete search history.

(56) References Cited

U.S. PATENT DOCUMENTS 5,479,108 A * 12/1995 Cheng .................. H01L 21/681
324/750.19
6,949,733 B2  9/2005 Widdowson et al.
(Continued)

FOREIGN PATENT DOCUMENTS

DE  102006024579 A1  11/2007
DE  102008010284 A1  8/2009
(Continued)

OTHER PUBLICATIONS

A New Dimension in the Nanometer Range dated Feb. 24, 2015—Heidenhain (https://www.heidenhain.us/application-stories/a-new-dimension-in-the-nanometer-range/) (Year: 2015).*
(Continued)

*Primary Examiner* — Terrell L McKinnon
*Assistant Examiner* — Ding Y Tan
(74) *Attorney, Agent, or Firm* — Leydig, Voit & Mayer Ltd.

(57) ABSTRACT

A gantry-type positioning device includes first and second cross members. Two linear guides are disposed parallel to each other on a base and support the first and second cross members such that the cross members are movable in a first direction. A Y-carriage has a functional element and is supported on the first cross member such that the Y-carriage and the functional element are movable in a second direction. A position-measuring device is disposed on the second cross member and the Y-carriage such that a position of the Y-carriage relative to the second cross member is detectable. A Z-carriage supports the functional element such that the functional element is movable relative to the Y-carriage in a third direction. A further position-measuring device is disposed on the Y-carriage and the functional element such that a position of the functional element relative to the Y-carriage is detectable.

13 Claims, 3 Drawing Sheets

(51) Int. Cl.
*H05K 13/00* (2006.01)
*G05B 19/402* (2006.01)
*H05K 13/04* (2006.01)
*H01L 21/68* (2006.01)
*H05K 3/00* (2006.01)

(56) References Cited

U.S. PATENT DOCUMENTS

| | | |
|---|---|---|
| 7,684,059 B2 | 3/2010 | Metz et al. |
| 8,040,099 B2 | 10/2011 | Coleman et al. |
| 9,921,468 B2 | 3/2018 | Holzapfel et al. |
| 9,979,262 B2 | 5/2018 | Maamari et al. |
| 2004/0178327 A1 | 9/2004 | Widdowson et al. |
| 2010/0066298 A1* | 3/2010 | Coleman ............ G01D 5/34746 318/652 |
| 2015/0280529 A1 | 10/2015 | Maamari et al. |
| 2016/0224008 A1 | 8/2016 | Heiniger et al. |

FOREIGN PATENT DOCUMENTS

| | | | | |
|---|---|---|---|---|
| DE | 102015219810 A1 | | 4/2017 | |
| EP | 2066996 B1 | | 8/2012 | |
| EP | 2849011 A1 | * | 3/2015 | ............. B23Q 1/626 |
| EP | 2849011 A1 | | 3/2015 | |
| EP | 2924721 A1 | * | 9/2015 | ............... H02K 5/24 |
| WO | WO 02067648 A1 | | 8/2002 | |
| WO | WO-2009103743 | * | 8/2009 | |
| WO | WO-2013143677 | * | 10/2013 | |

OTHER PUBLICATIONS

Standa XY linear gantry system with Z-axis stage youtube video dated Apr. 18, 2017, https://www.youtube.com/watch?v=3KHyiUR8mf4 (Year: 2017).*

Heidenhain online webpage: "A New Dimension in the Nanometer Range" Feb. 24, 2015 https://www.heidenhain.us/application-stories/a-new-dimension-in-the-nanometer-range/ (Year: 2015).*

Heidenhain Info Electronics, vol. 1, "A New Dimension in the Nanometer Range", Dec. 2009, pp. 1-8.

* cited by examiner

GANTRY-TYPE POSITIONING DEVICE

CROSS-REFERENCE TO PRIOR APPLICATION

Priority is claimed to European Patent Application No. EP 17187633.7, filed on Aug. 24, 2017, the entire disclosure of which is hereby incorporated by reference herein.

FIELD

The present invention relates to a gantry-type positioning device having two parallel, driven linear axes for a first direction, as well as a cross member that is displaceable along these linear axes and supports a functional element such that it is displaceable in a second direction, so that the functional element is positionable in or parallel to a plane between the two parallel linear axes. The positioning device further includes a driven linear axis that allows the functional element to be displaced perpendicularly to this plane, for example, to populate a printed circuit board with components or to wire it.

Such positioning devices are also referred to as gantry drive or X-Y gantry and are used in many fields of technology. The processing of planar substrates, such as wafers or printed circuit boards, is a typical application for such gantry drives. As miniaturization proceeds, positioning accuracy requirements increase here as well.

BACKGROUND

EP 2066996 B1 describes a gantry-type positioning device which, in order to determine position more accurately, uses position-measuring systems which, in addition to the position in the actual measurement direction along a linear guide, are also able to detect small positional deviations in a direction transverse thereto (such as, for example, guidance errors). For that purpose, scales are used which, in addition to the actual measuring track in the measurement direction, also carry what is referred to as a "straightness track," from which such small deviations transverse to the measurement direction can be read. Such scales are also referred to as "1Dplus scales," because, in addition to covering one measurement direction (1D), they also permit measurement in a further direction, albeit only small deviations in this direction. Such scales and corresponding position-measuring systems are described in greater detail in the publication HEIDENHAIN INFO, Electronics, Volume 1, 2009, which also describes a use of such scales on a gantry-type positioning device.

For the actual measurement direction, a typical 1Dplus scale carries an incremental track or, more generally, a measuring track, which may include fine, short lines transverse to the measurement direction that are, for example, optically scanned by a scanning head movable relative to the scale. The straightness track includes a few long lines, which are arranged parallel to the actual measurement direction (and thus transverse to the direction of the guidance errors) next to the incremental track. This straightness track is also scanned by the scanning head. By scanning the scale tracks, periodic signals are obtained in response to a relative movement between the scale and the scanning head. Hence, the extent of the displacement, and thus a position, can be determined by counting the periods and subdividing the individual periods (interpolation). Thus, position values in two directions independent of each other can be read from a 1Dplus scale.

The prior art has also described dual-gantry systems in which two displaceable cross members are arranged between the two linear guides in the first direction. WO 02/067648 A1, for example, describes a machine tool for processing printed circuit boards, which has a second cross member having additional processing tools in order to increase productivity.

US 2015/0280529 A1, which forms the basis for the present invention, describes a gantry-type positioning device having two linear guides that are disposed parallel to each other on a base and support a first cross member and a second cross member such that they are movable in a first direction. A Y-carriage having a functional element is supported on the first cross member such that it is movable in a second direction. On the Y-carriage and on the second cross member, position-measuring devices are disposed for measuring the position of the Y-carriage relative to the second cross member. Because the position of the Y-carriage is measured relative to a second cross member that is influenced neither mechanically nor thermally, and thus is dimensionally significantly more stable than the first cross member carrying the Y-carriage, the spatial position of the Y-carriage can be detected with significantly greater accuracy. By using additional actuators for fine positioning, which are effective between the Y-carriage and the functional element, the functional element can be positioned with greater accuracy in all degrees of freedom, regardless of any deformation of the first cross member.

However, with this positioning device, it is not possible to monitor the positioning of the functional element in a direction perpendicular to the base, which is effected by another, actuated linear guide. Displacements of the tool center point (TCP) of the functional element parallel to the plane of the base, which occur during vertical movement of the functional element, cannot be detected and therefore cannot be compensated for.

SUMMARY

In an embodiment, the present invention provides a gantry-type positioning device including a first cross member and a second cross member. Two linear guides are disposed parallel to each other on a base and support the first and second cross members such that the first and second cross members are movable in a first direction. A Y-carriage has a functional element and is supported on the first cross member such that the Y-carriage and the functional element are movable in a second direction. A position-measuring device is disposed on the second cross member and the Y-carriage such that a position of the Y-carriage relative to the second cross member is detectable by the position-measuring device. A Z-carriage supports the functional element such that the functional element is movable relative to the Y-carriage in a third direction. A further position-measuring device is disposed on the Y-carriage and the functional element such that a position of the functional element relative to the Y-carriage is detectable by the further position-measuring device.

BRIEF DESCRIPTION OF THE DRAWINGS

The present invention will be described in even greater detail below based on the exemplary figures. The invention is not limited to the exemplary embodiments. All features described and/or illustrated herein can be used alone or combined in different combinations in embodiments of the invention. The features and advantages of various embodiments of the present invention will become apparent by reading the following detailed description with reference to the attached drawings which illustrate the following.

DETAILED DESCRIPTION

In an embodiment, the present invention provides a gantry-type positioning device that allows the position of the functional element to be detected with even greater accuracy, thereby enabling precise positioning thereof.

According to an embodiment, a gantry-type positioning device has two linear guides that are disposed parallel to each other on a base and support a first cross member and a second cross member such that they are movable in a first direction, a Y-carriage having a functional element being supported on the first cross member such that it is movable in a second direction, and a position-measuring device being disposed on the second cross member and the Y-carriage for detecting the position of the Y-carriage relative to the second cross member. The functional element is supported by a Z-carriage such that it is movable relative to the Y-carriage in a third direction, a further position-measuring device being disposed on the Y-carriage and the functional element for detecting the position of the functional element relative to the Y-carriage.

The further position-measuring device makes it possible to measure the displacement of the functional element relative to the Y-carriage in the first and second directions.

The proven concept of a movable reference system that is supported with no process forces acting on it and permits accurate position measurements is thus extended to cover a further measurement direction. By omitting separate actuators for the second cross member, the construction is even simplified compared to the prior art and may be made so compact that even a dual-gantry system becomes possible.

Figure 1:
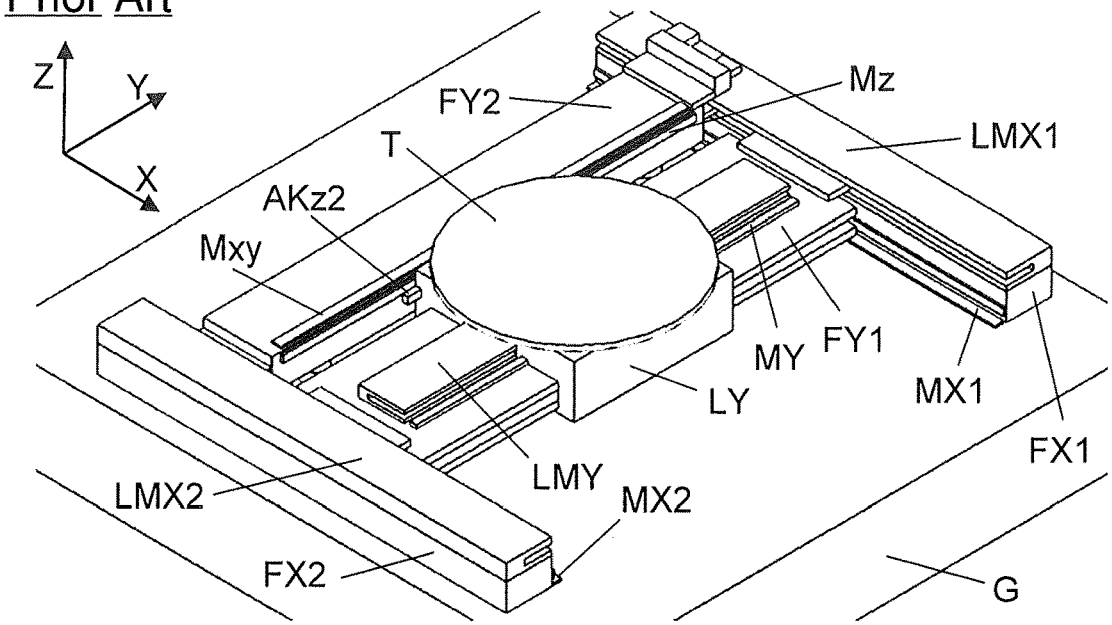
FIG. 1 shows a conventional gantry-type positioning device.

FIG. 1 shows a gantry-type positioning device known in the prior art. Disposed on a base G in the form of a granite block, for example, are two parallel linear guides FX1, FX2, which support a cross member FY1 such that it is displaceable in the X-direction. To move cross member FY1, two linear motors LMX1, LMX2 are used, which are arranged parallel to linear guides FX1, FX2 or integrated into them. A Y-carriage LY is guided on cross member FY1 so as to be displaceable in the Y-direction by means of a further linear motor LMY.

Y-carriage LY carries a table T as an example of a functional element. A wafer may be placed on table T and then processed or inspected by a tool stationarily mounted above the positioning device.

The positioning of the linear axes in the X- and Y-directions is accomplished with the aid of scales MX1, MX2, MY along the respective guides FX1, FX2, FY1 (also referred to herein as a first cross member), which are scanned by scanning heads to determine the current positions of all axes at any one time. All movable axes are controlled to move to the respective target positions by conventional position controllers, and thus table T is positioned in the X-Y plane.

Y-carriage LY moves relative to cross member FY1 mainly in the Y-direction, but is also movable in the degrees of freedom of rotation about the X- and Y-directions as well as linear shift in the Z-direction because of guidance errors and elasticities in the various components.

Also shown is a second cross member FY2. This second cross member FY2 has its own actuators for the X-direction, and thus can be positioned independently of first cross member FY1. However, it is maintained at a fixed distance from first cross member FY1 by its position controller. This distance must be maintained with such accuracy that the position-measuring device described further below can be reliably evaluated to detect the position of Y-carriage LY relative to second cross member FY2. The distance tolerance of the position-measuring device within which an evaluation is still possible is typically approximately 200 micrometers.

Accommodated in Y-carriage LY are actuators which permit fine positioning of table T during the scanning movement of Y-carriage LY. Such fine positioning should be possible at least for rotations about the X- and Y-axes, and for the Z-direction. Position correction in X and Y, and rotation about the Z-axis may also be accomplished with the actuators of the gantry-type positioning device. Thus, deviations from a desired scanning movement can be corrected in all six degrees of freedom, which, however, must be measured for this purpose.

Second cross member FY2 is used as a reference system for this position measurement, and is therefore also referred to as a movable reference system herein. This approach has the advantage that no forces are exerted on second cross member FY2 by the scanning movements of Y-carriage LY, and also that the actuators of first cross member FY1 introduce no heat into second cross member FY2.

If one waits a certain time after each change in position (stepping movement) of first and second cross members FY1, FY2, so that vibrations of second cross member FY2 have subsided, the latter can be regarded as stationary. Since second cross member FY2 does not carry a Y-carriage, it can be made particularly lightweight, whereby its resonant frequencies are particularly high and vibrations subside quickly.

If the exact position of second cross member FY2 is determined relative to base G (a possible arrangement of measurement systems for this purpose is described in the above-mentioned US 2015/0280529 A1), second cross member FY2 is suitable as a reference system for measuring the position of Y-carriage LY in all degrees of freedom during the scanning movement of Y-carriage LY; i.e., of table T. Thus, if one measures the position of Y-carriage LY directly in relation to second cross member FY2 in all degrees of freedom, deformations of first cross member FY1 (due, for example, to acceleration forces, the weight of the Y-carriage, temperature influences, vibrations) can be detected and compensated for by means of the available actuators (the fine positioning of table T and/or the axes of the gantry-type positioning device).

In order to actually prevent any reaction being exerted by first cross member FY1 on second cross member FY2, vibrations of base G should be actively damped, so that not only vibrations from the outside are blocked, but also those which are introduced into base G by the process forces of first cross member FY1 and second cross member FY2.

To determine the position of Y-carriage LY relative to second cross member FY2, scales Mxy, Mz are provided on the second cross member, and a scanning head AKz2 is provided on the Y-carriage. Other scales and scanning heads are not illustrated in this view, but a possible arrangement thereof is disclosed in the above-referenced US 2015/0280529 A1. Thus, the position of Y-carriage LY relative to second cross member FY2 can be measured in all 6 degrees of freedom.

Figure 2:
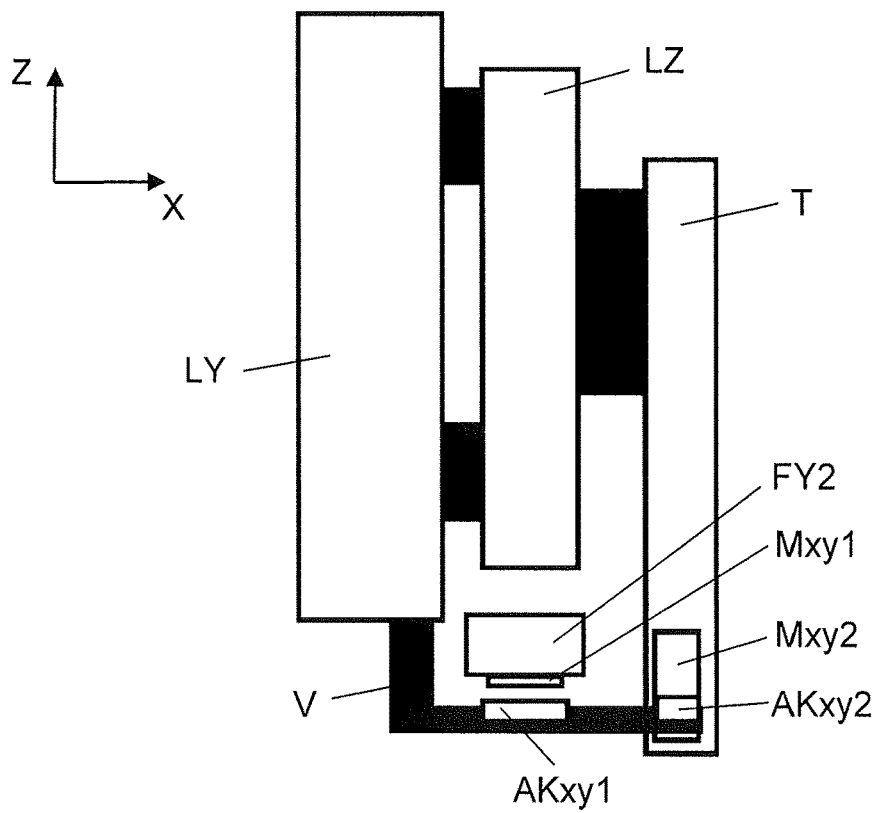
FIG. 2 shows a first gantry-type positioning device according to an embodiment of the present invention.

However, a problem arises when, in such an arrangement, functional element T additionally needs to be positioned in a third direction Z as well. FIG. 2 illustrates the problem and its solution with reference to a simplified first exemplary embodiment of the present invention. One can see Y-carriage LY and a Z-carriage LZ guided thereon in the Z-direction. Functional element T should be mounted as rigidly as possible to this Z-carriage LZ. Thus, functional element T can also be positioned in third direction Z by means of a linear actuator.

This functional element T may be, for example, an element for positioning a component on a circuit board placed on granite G. This Z-axis also exhibits guidance errors, and both Y-carriage LY and functional element T, including its attachment, are not completely rigid. All of these effects may lead to an offset of functional element T in the X- and Y-directions, which may depend on its position in the Z-direction.

FIG. 2 schematically illustrates that a 1Dplus scale Mxy1 on second cross member FY2 is scanned by a scanning head AKxy1 attached to Y-carriage LY via a rigid connection V. With two such scanning heads AKxy1 arranged one behind the other in the Y-direction, it is possible to determine the position of Y-carriage LY relative to second cross member FY2, and, more specifically, with respect to the X- and Y-directions and rotation about the Z-direction. This measurement of the relative position between Y-carriage LY and second cross member FY2 corresponds to the prior art illustrated in FIG. 1.

In order now to be able to additionally measure the displacement of functional element T in the X- and Y-directions, two further scanning heads AKxy2, AKxy2' are disposed on rigid connection V with Y-carriage LY, of which only one can be seen in FIG. 2. Second scanning head AKxy2' is disposed behind the first one in the Y-direction. These scanning heads AKxy2, AKxy2' scan two 1Dplus scales Mxy2, Mxy2', which are mounted laterally on functional element T, one behind the other in the Y-direction. This combination of scanning heads AKxy2, AKxy2' and 1Dplus scales Mxy2, Mxy2', which forms a further position-measuring device, makes it possible to measure the offset of functional element T relative to Y-carriage LY not only in the Z-direction, but also in the X- and Y-directions when the two horizontal measurements on 1Dplus scales Mxy2, Mxy2 each capture components in both directions X, Y which are appropriately arithmetically combined. Since, as known from the prior art, the relative position between Y-carriage LY and second cross member FY2, on the one hand, and the relative position of functional element T relative to Y-carriage LY, on the other hand, are known, the relative position of functional element T with respect to second cross member FY2 can also be calculated. The position of second cross member FY2 relative to base G can be detected with high accuracy, so that the position information relative to second cross member FY2 can also be transformed into a reference system at rest with respect to base G. This is based on the assumption that connection V is very rigid.

Figure 3:
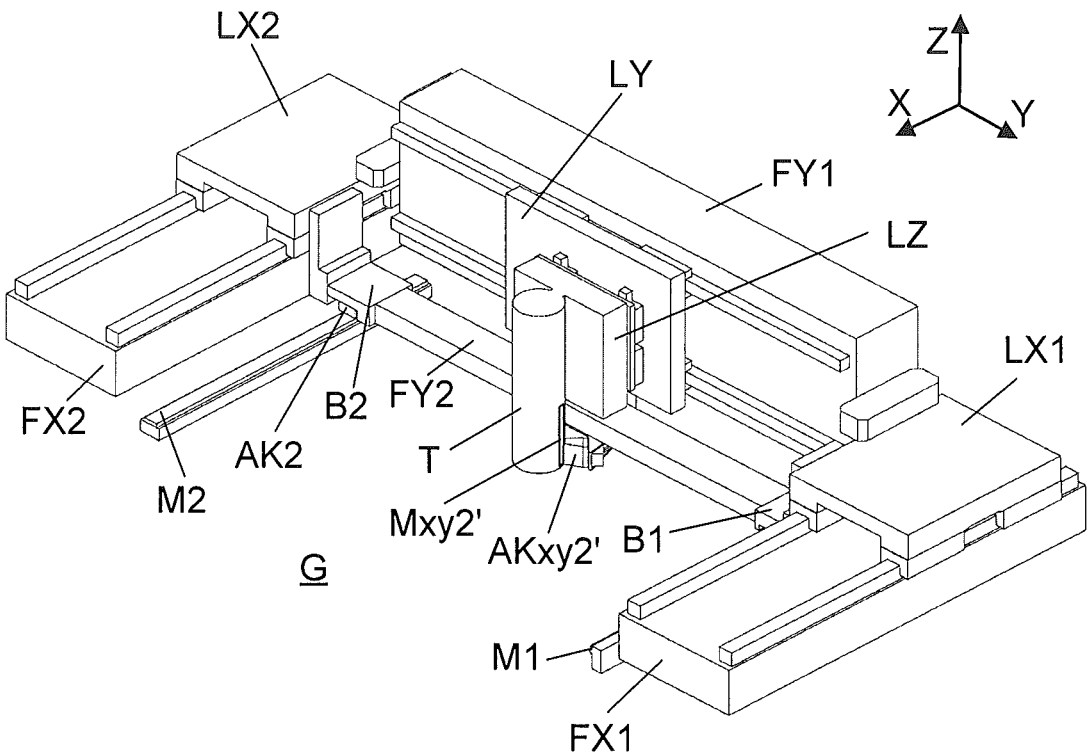
FIG. 3 shows a first view of a further positioning device according to an embodiment of the present invention.
Figure 4:
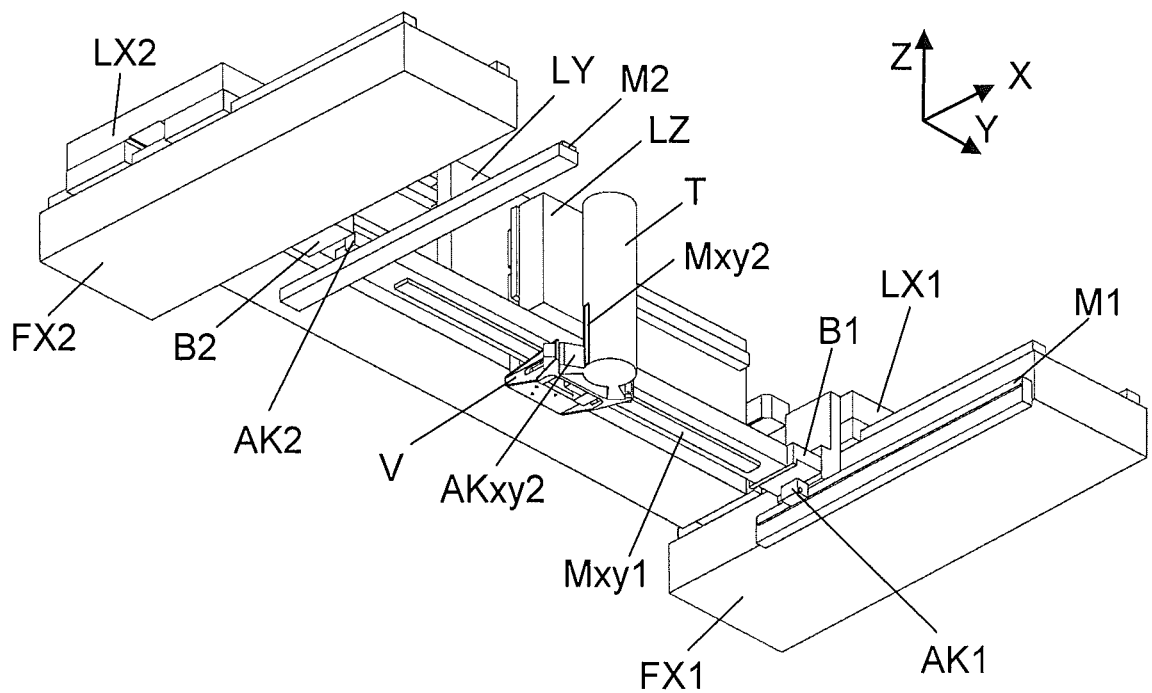
FIG. 4 shows a second view of this further positioning device according to an embodiment of the present invention.

FIGS. 3 and 4 show another, specific exemplary embodiment of the present invention. Base G has been omitted here and is merely represented by a reference numeral so as to better illustrate the details of the present invention as well as the differences from the system of FIG. 1.

It can be seen that now second cross member FY2 itself no longer has any actuators, but is mounted to X-carriages LX1, LX2 via mounting elements B1, B2 and, therefore, is carried along by these X-carriages LX1, LX2. Since these X-carriages LX1, LX2 also move first cross member FY1, an approximately constant distance is ensured between the two cross members FY1, FY2.

Second cross member FY2 should, to the extent possible, be maintained free of forces, so that it does not bend and is able to perform its function as a co-moving reference system. Therefore, mounting elements B1, B2 should include flexible elements which are capable of supporting the weight of second cross member FY2 and ensure that it is carried along in first direction X, but which otherwise do not introduce any bending forces into second cross member FY2. For example, the first mounting element may be a flexure joint that blocks all degrees of freedom except for rotation about the Z-direction. Second mounting element B2 should then block all degrees of freedom except for motion in the Y-direction and rotation about the Z-direction. This may be achieved, for example, by a combination of a flexure joint with a folded joint in the manner of a SCARA robot.

To be able to build systems for increased throughput, with two first cross members FY1 and two functional elements T that may come close to one another, second cross member FY2 is now disposed in third direction Z between base G and the assembly formed by first cross member FY1, Y-carriage LY, Z-carriage LZ and functional element T; i.e., below this assembly and, therefore, does not require any additional space in first direction X. Rigid connection V extends between base G and second cross member FY2. This advantageous configuration can be readily seen also in FIG. 2. Such a dual-gantry system then has two first cross members FY1 which are each associated with a second cross member FY2. In such systems, functional elements T typically face each other. Because of the special disposition of second cross member FY2, the two functional elements T may come almost arbitrarily close to each other.

FIGS. 3 and 4 further show scales M1, M2, which are rigidly attached to base G. Scanning heads AK1, AK2 near mounting elements B1, B2 are used to determine the position of second cross member FY2 relative to base G.

Thus, base G carries two separate cross members FY1, FY2: first cross member FY1 supports all process forces and may bend, but the crucial position measurements are made relative to second cross member FY2 (either directly or indirectly, as in the case of the X-Y offset of functional element T). Since the position of second cross member FY2 relative to base G is well known, and because it does not bend even under the action of process forces, it is possible to determine the ultimately decisive position of functional element T relative to base G. This is now also true for positional deviations which are caused by position-dependent guidance errors of Z-carriage LZ or by forces acting functional element T and which were unable to be detected the prior art.

Thus, functional element T can be used to process an object placed on base G, namely at very precisely defined locations on the object.

In a modification of the arrangement of scales M1, M2 shown in FIGS. 3 and 4, which are used for determining the position of second cross member FY2 and, in the arrangement shown, are rigidly attached to base G, these scales M1, M2 may also be mounted on a superstructure that is disposed on base G and itself does not have to be rigid or thermally stable. This superstructure may be, for example, a handling system for objects such as wafers or printed circuit boards.

If scales M1, M2 are mounted on the superstructure at the level of these objects, accurate processing of these objects is still possible because the position of FY2 is now determined relative to scales M1, M2, which, in the event of deformation of the superstructure, move along with the object.

Figure 5:
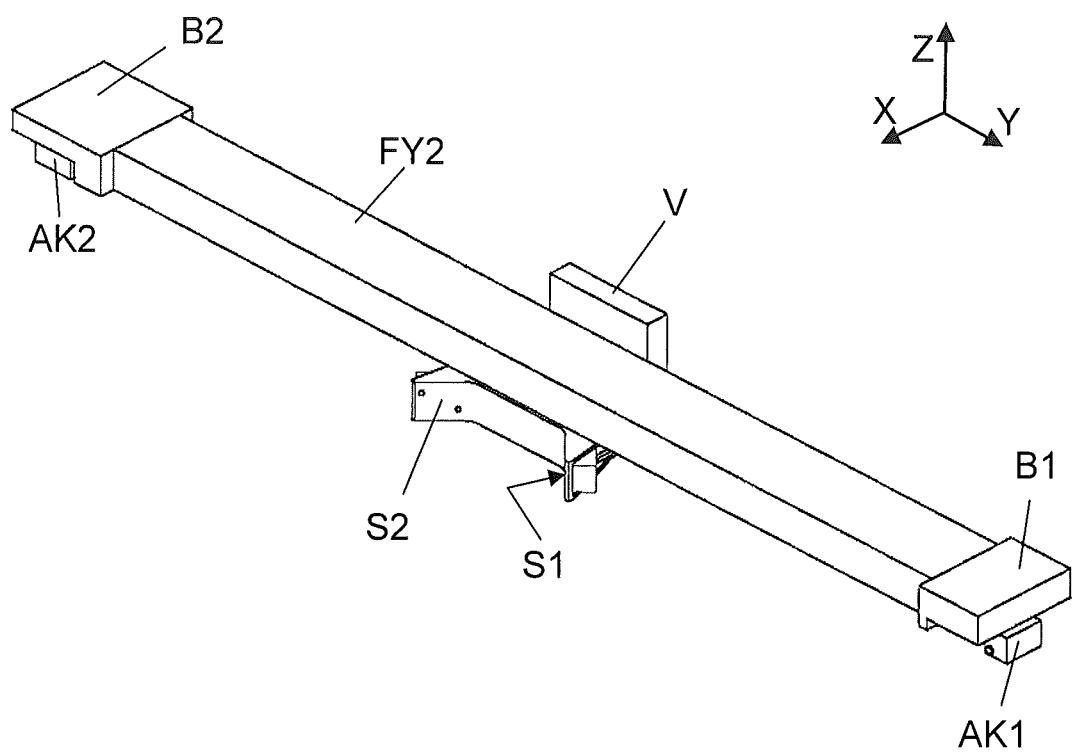
FIG. 5 depicts a detail view of this further positioning device according to an embodiment of the present invention.

FIG. 5 shows a detail view of second cross member FY2, including mounting elements B1, B2 and rigid connection V, which starts at Y-carriage LY and embraces second cross member FY2. At the forward end of rigid connection V, there can be seen two mounting faces S1, S2 which are each oriented at an angle of 45 degrees relative to first and second directions X, Y, forming an angle of 90 degrees with each other. Mounted to these mounting faces S1, S2 are scanning heads AKxy2, AKxy2', which scan the two 1Dplus scales Mxy2, Mxy2', which are mounted on functional element T at a 90 degree offset with respect to rotation about third direction Z. The two scanning heads AKxy2, AKxy2' then also define an angle of 90 degrees and provide the position of functional element T relative to Y-carriage LY in third direction Z as well as a mixture of the X- and Y-offsets. Through a simple trigonometric conversion, this mixture can be converted into the offset of functional element T relative to Y-carriage LY in first direction X and second direction Y. This conversion is determined by the geometric arrangement of scales Mxy2, Mxy2' and scanning heads AKxy2, AKxy2'.

While the invention has been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below. Additionally, statements made herein characterizing the invention refer to an embodiment of the invention and not necessarily all embodiments.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

What is claimed is:

1. A gantry-type positioning device, comprising:
   a first cross member and a second cross member;
   two linear guides that are disposed parallel to each other on a base and support the first and second cross members such that the first and second cross members are movable in a first direction;
   a Y-carriage having a functional element and being supported on the first cross member such that the Y-carriage and the functional element are movable in a second direction;
   a position-measuring device disposed on the second cross member and the Y-carriage such that a position of the Y-carriage relative to the second cross member is detectable by the position-measuring device;
   a Z-carriage which supports the functional element such that the functional element is movable relative to the Y-carriage in a third direction; and
   a further position-measuring device disposed on the Y-carriage and the functional element such that a position of the functional element relative to the Y-carriage is detectable by the further position-measuring device,
   wherein the first, second and third directions are perpendicular to each other, and
   wherein the second cross member is disposed in the third direction above the base and below an assembly formed by the first cross member, the Y-carriage, the Z-carriage and the functional element.

2. The positioning device as recited in claim 1, wherein the further position-measuring device is configured to enable a measurement of displacement of the functional element relative to the Y-carriage in the first and second directions.

3. The positioning device as recited in claim 2, wherein the further position-measuring device includes two 1Dplus scales which each have a measuring track for the third direction and a straightness track for the first and/or second direction(s), the further position-measuring device including two scanning heads each being directed at a respective one of the 1Dplus scales.

4. The positioning device as recited in claim 3, wherein the straightness tracks of the 1Dplus scales intersect both the first and the second directions at an angle such that the displacement of functional element is derivable by arithmetically combining the position values of the two scanning heads.

5. The positioning device as recited in claim 3, wherein the scanning heads are attached to the Y-carriage via a rigid connection, and wherein the 1Dplus scales are mounted on the functional element.

6. The positioning device as recited in claim 5, wherein the rigid connection additionally carries a further scanning head of the position-measuring device for detecting the position of the Y-carriage relative to the second cross member.

7. The positioning device as recited in claim 5, wherein the rigid connection has mounting faces for the scanning heads, the mounting faces forming an angle of 90 degrees with each other.

8. The positioning device as recited in claim 5, wherein the 1Dplus scales are mounted on the functional element such that the 1Dplus scales are angularly offset from each other by 90 degrees about the third direction.

9. The positioning device as recited in claim 1, wherein the second cross member is mounted to two X-carriages via two mounting elements.

10. The positioning device as recited in claim 9, wherein the mounting elements include flexible elements which support the weight of the second cross member and are configured to ensure that the second cross member is carried along in the first direction without otherwise introducing bending forces into the second cross member.

11. The positioning device as recited in claim 1, further comprising a rigid connection that extends between the base and the second cross member.

12. The positioning device as recited in claim 1, further comprising a position sensor configured to enable a detection of a position of the second cross member relative to an absolute reference system such that the second cross member serves as a movable reference system for a determination of the position of the Y-carriage spatially relative to the absolute reference system.

13. The positioning device as recited in claim 1, wherein the second cross member is supported by flexible mounting elements which support the weight of the second cross member without introducing bending forces into the second cross member.

* * * * *